(12) United States Patent
Hwang et al.

(10) Patent No.: US 7,319,255 B2
(45) Date of Patent: Jan. 15, 2008

(54) SEMICONDUCTOR DEVICE INCLUDING A METAL GATE ELECTRODE FORMED IN A TRENCH AND METHOD OF FORMING THEREOF

(75) Inventors: Sung-Wook Hwang, Seoul (KR); Chang-Jin Kang, Suwon-si (KR); Kyeong-Koo Chi, Seoul (KR); Sung-Hoon Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/138,034

(22) Filed: May 26, 2005

(65) Prior Publication Data

US 2005/0275042 A1    Dec. 15, 2005

(30) Foreign Application Priority Data

Jun. 10, 2004    (KR) ............... 10-2004-0042613

(51) Int. Cl.
*H01L 29/94*    (2006.01)
*H01L 21/28*    (2006.01)

(52) U.S. Cl. .............. 257/330; 257/213; 257/288; 257/327; 257/329; 257/E29.13; 257/E21.428; 438/584; 438/585; 438/589

(58) Field of Classification Search .............. None
See application file for complete search history.

(56) References Cited

U.S. PATENT DOCUMENTS

| | | | |
|---|---|---|---|
| 6,054,355 A * | 4/2000 | Inumiya et al. | |
| 6,093,947 A | 7/2000 | Hanafi et al. | 257/330 |
| 6,214,670 B1 * | 4/2001 | Shih et al. | 438/259 |
| 6,660,591 B2 | 12/2003 | Peake et al. | 438/270 |

FOREIGN PATENT DOCUMENTS

JP    2004-039985    2/2004

* cited by examiner

*Primary Examiner*—Leonardo Andujar
*Assistant Examiner*—Kevin Quinto
(74) *Attorney, Agent, or Firm*—F. Chau & Associates, LLC (57) ABSTRACT

A semiconductor device including a transistor and a method of forming thereof are provided. The semiconductor device comprises a metal gate electrode. A lower portion of the metal gate electrode fills a channel trench formed at a predetermined region of a substrate, and an upper portion of the metal gate electrode protrudes on the substrate. A gate insulating layer is interposed between inner sidewalls and a bottom surface of the channel trench, and the metal gate electrode. Source/drain regions are formed at the substrate in both sides of the metal gate electrode.

15 Claims, 5 Drawing Sheets

Fig. 1

(PRIOR ART)

SEMICONDUCTOR DEVICE INCLUDING A METAL GATE ELECTRODE FORMED IN A TRENCH AND METHOD OF FORMING THEREOF

CROSS-REFERENCE TO RELATED APPLICATIONS

This patent application claims priority under 35 U.S.C. § 119 to Korean Patent Application 2004-42613 filed on Jun. 10, 2004, the entire contents of which are hereby incorporated by reference.

BACKGROUND OF THE INVENTION

The present invention relates to semiconductor devices and methods of forming thereof, more particularly, to a semiconductor device having a field effect transistor and a method of forming thereof.

In semiconductor devices, a field effect transistor (hereinafter referred to as "a transistor") includes source/drain regions that are formed apart from each other in the substrate and the gate electrode is disposed on a channel region between the source/drain regions with a gate oxide layer interposed therebetween.

In general, the gate electrode includes doped polysilicon. As the doped polysilicon is formed by a very simple method, and has a good interfacial characteristic with the gate oxide layer formed of a silicon oxide layer, it is widely used as a gate electrode of a transistor.

As the degree of integration for semiconductor devices becomes higher, the line-width of a gate electrode gradually decreases. Accordingly, as the resistance of the gate electrode increases, the operational speed of the transistor becomes slower. In order to overcome this problem, a method for forming a gate electrode with polycide has been suggested. The polycide consists of doped polysilicon and tungsten silicide, which are sequentially stacked. A transistor including a gate electrode formed of polycide is disclosed in Korean Laid-open Patent Publication No. 2004-37957.

Figure 1:
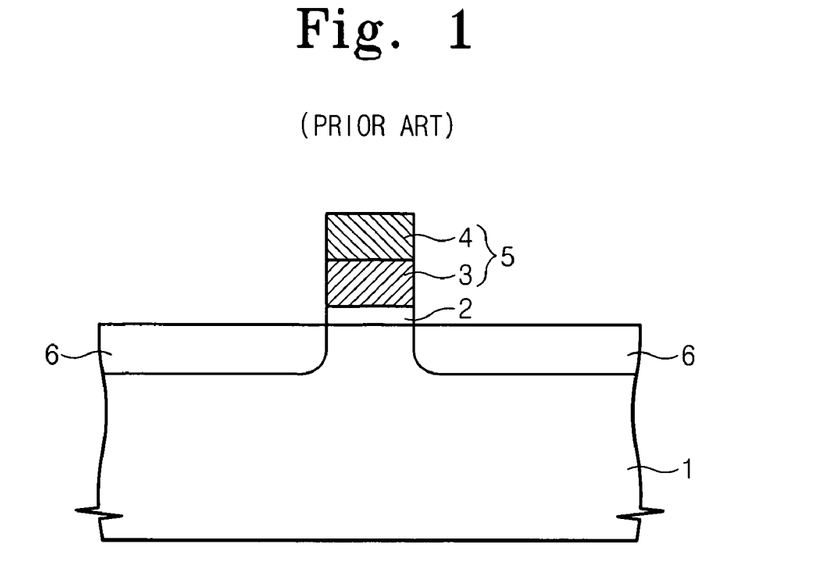
FIG. 1 is a schematic view illustrating a field effect transistor of a conventional semiconductor device.

FIG. 1 is a schematic view illustrating a field effect transistor of a conventional semiconductor device.

With reference to FIG. 1, a gate oxide layer 2, a doped polysilicon pattern 3 and a tungsten silicide pattern 4 are sequentially stacked on an active region of a semiconductor substrate 1. The tungsten silicide pattern 4 has a resistivity lower than the dope polysilicon pattern 3. Source/drain regions 6 are formed at the active region at both sides of a gate electrode 5.

The gate electrode 5 includes the doped polysilicon pattern 3 and the tungsten silicide pattern 4 formed on the doped polysilicon pattern 3. Due to the low resistivity of the tungsten silicide pattern 4, the resistance of the gate electrode 5 is decreased and the operational speed of a transistor may become fast.

However, as the current state of the art requires a semiconductor device having a minimum line-width of less than 100 nm, although the gate electrode 5 is formed of polycide, the resistance of the gate electrode 5 will increase due to the decreased line-width, and the operational speed of the transistor may gradually decrease. In addition, as the length of the channel region below the gate electrode 5 decreases, thereby inducing a short channel effect etc., it leads to a punch through characteristic between the source/drain regions 6. Accordingly, there are many problems in scaling down a transistor due to the above problems.

In addition, the gate electrode 5 is formed with a patterning process including a plasma etching process. Accordingly, the gate oxide layer 2 below the edges of the gate electrode 5 may be plasma-damaged. As a result, the characteristics of a transistor may deteriorate.

SUMMARY OF THE INVENTION

One embodiment of the present invention provides a semiconductor device including a transistor which can be operated at a high speed and a method of forming thereof.

Another embodiment of the present invention provides a semiconductor device which can improve the punch-through characteristic between source/drain regions and a method of forming thereof.

Still another embodiment of the present invention provides a highly integrated and optimized semiconductor device and a method for of forming thereof.

In the present invention, a semiconductor device including a transistor is provided. The device includes a metal gate electrode. The lower portion of the metal gate electrode fills the channel trench formed at a predetermined region of a substrate, and an upper portion of the metal gate electrode protrudes out of the substrate. The gate insulating layer is interposed between the inner sidewalls and the bottom surface of the channel trench, and the metal gate electrode. The source/drain regions are disposed in the substrate at both sides of the metal gate electrode.

In an embodiment of the present invention, it is preferable that the bottom surface of the channel trench is lower than that of the source/drain regions. The device may further include a capping pattern disposed on the metal gate electrode. The capping pattern has sidewalls aligned on the sidewalls of the metal gate electrode. It is preferable that the device further includes a barrier conductive pattern interposed between the gate insulating layer and the metal gate electrode. At this time, it is preferable that both ends of the barrier conductive pattern are extended upwardly to cover both sidewalls of the upper portion of the metal gate electrode. In this case, the capping pattern has sidewalls aligned on the sidewalls of the extended portion of the barrier conductive pattern. The device may further include a gate insulating spacer covering both sidewalls of the capping pattern and both sidewall of the upper portion of the metal gate electrode. At this time, the extended portion of the barrier conductive pattern is interposed between the metal gate electrode and the gate insulating spacer.

A method for forming a semiconductor device including a transistor is provided. The method includes the steps of patterning a mold layer formed on a substrate to form an opening exposing a predetermined region of the substrate, and etching the exposed substrate to form a channel trench. The gate insulating layer is formed on the inner sidewalls and the bottom surface of the channel trench, and the metal layer filling the opening and the channel trench is formed on the entire surface of the substrate. The metal layer is partially removed to form a metal gate electrode in the opening and the channel trench, and the mold layer is selectively removed. The source/drain regions are formed on the substrate at both sides of the metal gate electrode.

In an embodiment of the present invention, it is preferable that the method further includes forming a sidewall spacer on the inner sidewalls of the opening, before forming the channel trench. The exposed substrate is etched using the mold layer and the sidewall spacer as a mask to form the channel trench. The method may further include removing the sidewall spacer, after forming the metal gate electrode.

It is preferable that the bottom surface of the channel trench is formed to be lower than the lower surface of the source/drain regions. The method may further include the steps of recessing an upper surface of the metal gate electrode to empty a part of the opening, and a capping pattern is formed to fill the empty region of the opening, before removing the mold layer. The method may further include a step of forming a buffer insulating layer on the substrate, before forming the mold layer. In this case, the opening is formed by successively patterning the mold layer and the buffer insulating layer. The method may further include a step of removing the buffer insulating layer, after removing the mold layer. In addition, the method may further include a step of forming a hard mask layer on the mold layer, after forming the mold layer. In this case, the opening is formed by successively patterning the hard mask layer, the mold layer and the buffer insulating layer. The method may further include a step of removing the hard mask layer, before removing the mold layer. The method may further include a step of conformally forming a barrier conductive layer on a substrate having the gate insulating layer. The step of forming the metal gate electrode may include the step of removing a part of the metal layer and a part of the barrier conductive layer to form a barrier conductive pattern and the metal gate electrode, which are sequentially stacked in the opening and the channel trench. The method may further include the steps of recessing the top surface of the metal gate electrode and the barrier conductive pattern to empty a part of the opening, and forming a capping pattern to fill the empty region of the opening, before removing the mold layer. The method may further include the step of forming a gate insulating spacer to cover both sidewalls of the capping pattern and both sidewalls of the portion protruded on the substrate of the metal gate electrode. In this case, a part of the barrier conductive pattern is interposed between the metal gate electrode and the gate insulating spacer.

BRIEF DESCRIPTION OF THE DRAWINGS

The present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that an optional layer refers to a layer which may not be formed, but refers to a layer which is desirable to form. Like numbers refer to like elements throughout the specification.

Figure 2:
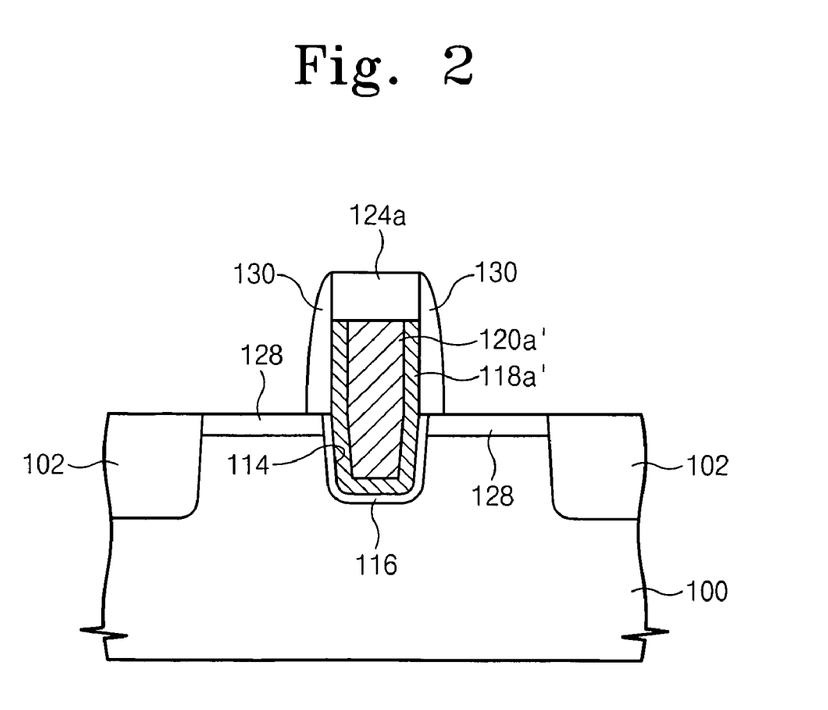
FIG. 2 is a cross-sectional view of a semiconductor device including a transistor in accordance with an embodiment of the present invention.

FIG. 2 is a cross-sectional view illustrating a semiconductor device including a transistor in accordance with an embodiment of the present invention.

With reference to FIG. 2, a device isolation layer 102 for defining an active region is disposed at a predetermined region of a semiconductor substrate 100 (hereinafter referred to as "a substrate"). The device isolation layer 102 may be a shallow trench type device isolation layer.

A metal gate electrode 120a' crossing over the active region is disposed on the substrate 100. At this time, a channel trench 114 is formed at the active region below the metal gate electrode 120a'. The bottom surface of the channel trench 114 is lower than the top surface of the active region. The metal gate electrode 120a' is extended downwardly to fill the channel trench 114. In other words, a lower portion of the metal gate electrode 120a' fills the channel trench 114, and an upper portion of the metal gate electrode 120a' protrudes on the substrate 100 in a vertical direction. The width of the channel trench 114 may be less than a minimum line-width which can be defined by the photolithography process. A gate insulting layer 116 is interposed between inner sidewalls and the bottom surface of the channel trench 114, and the metal gate electrode 120a'.

The metal gate electrode 120a' is formed of a low resistivity metal in comparison with a conventional polycide. For example, the metal gate electrode 120a' may be formed of one of tungsten, aluminum, copper, or molybdenum or a combination thereof. The metal gate electrode 120a' may be formed of a low resistivity metal besides the above-mentioned metals. The gate insulating layer 116 may be formed of a silicon oxide layer, especially, a thermal oxide layer. Unlike this, the gate insulating layer 116 may be formed of a high-k dielectric layer having a higher dielectric constant than the silicon nitride layer. For example, the high-k dielectric layer may be formed of one of an aluminum oxide layer or a hafnium oxide layer being a metal oxide layer, or a combination thereof. As the gate insulating layer 116 is formed of the high-k dielectric layer, the capacitance between the metal gate electrode 120a' and the active region is increased, thereby increasing the thickness of the gate insulating layer 116. Therefore, it is possible to improve the insulating characteristic of the gate insulating layer 116.

It is preferable that a barrier conductive pattern 118a' is interposed between the gate insulating layer 116 and the metal gate electrode 120a'. The barrier conductive pattern 118a' represses reactions between the metal gate electrode 120a' and the gate insulating layer 116. In addition, the barrier conductive pattern 118a' prevents metal elements in the metal gate electrode 120a' from infiltrating into the gate insulating layer 116. Both ends of the barrier conductive pattern 118a' are extended upwardly to cover both sidewalls of the upper portion of the metal gate electrode 120a'. In other words, the barrier conductive pattern 118a' is formed in a shape of surrounding a lower surface and both sidewalls of the metal gate electrode 120a'. It is preferable that the conductive pattern 118a' includes a conductive metal nitride. For example, the barrier conductive pattern 118a' may be formed of one of titanium nitride (TiN), titanium/titanium nitride (Ti/TiN), tantalum nitride (TaN), tantalum/tantalum nitride (Ta/TaN), silicon-titanium nitride (TiSiN) or silicon-tantalum nitride (TaSiN) or a combination thereof.

A capping pattern 124a is disposed on the metal gate electrode 120a'. The capping pattern 124a covers a top surface of the metal gate electrode 120a' and the uppermost surface of the extended portion of the barrier conductive pattern 1118a'. At this time, the capping pattern 124a has sidewalls aligned on outer sidewalls of the extended portion of the barrier conductive pattern 118a'. Especially, the capping pattern 124a and outer sidewalls of the extended portion of the barrier conductive pattern 118a' can be disposed on the same imaginary vertical line. The imaginary vertical line is an imaginary line vertical with respect to a surface of the substrate 100. The capping pattern 124a is formed of an insulating material. For example, the capping pattern 124a may be formed of a silicon nitride layer.

In the meantime, the barrier conductive pattern 118a' can be omitted when occasion demands. In this case, the sidewalls of the capping pattern 124a are arranged on both sidewalls of the metal gate electrode 120a'. Especially, the sidewalls of the capping pattern 124a and the sidewalls of the metal gate electrode 120a may be aligned on the same imaginary vertical line.

A gate insulating spacer 130 covering the sidewalls of the capping pattern 124a and the protruded upper portion of the metal gate electrode 120a' may be disposed on the substrate 100. At this time, the extended portion of the barrier conductive pattern 118a' is interposed between the metal gate electrode 120a' and the gate insulating spacer 130. If the gate insulating layer 116 is formed of the high-k dielectric layer, both ends of the gate insulating layer 116 are extended upwardly and may be interposed between the extended portion of the barrier conductive pattern 118a' and the gate insulating spacer 130. The gate insulating spacer 130 may be formed of a silicon nitride layer or a silicon oxide layer being an insulating material. Especially, the gate insulating spacer 130 may be formed of the same material as the capping pattern 124a.

A source/drain region 128 is disposed in the active region at both sides of the metal gate electrode 120a'. The source/drain region 128 is formed of an impurity doped layer. It is preferable that the bottom surface of the channel trench 114 is lower than the lower surface of the source/drain region 128. As a channel region below the metal gate electrode 120a' is formed along with the bottom surface and both sidewalls of the channel trench 114, the distance between the source/drain regions 128, that is, the length of the channel region is increased. The source/drain region 128 may be a LDD (Lightly Doped Drain) structure.

The metal gate electrode 120a', the gate insulating layer 116 and the source/drain region 128 are included in a transistor.

In a semiconductor device having a transistor with the above-described structure, as the metal gate electrode 120a' is formed of a low resistivity metal in comparison with conventional polycide, an operational speed of the transistor is faster than that of the conventional transistor. As a result, a higher speed semiconductor device can be realized, and a highly integrated semiconductor device can be realized by decreasing a line-width of the gate electrode 120a'.

In addition, the channel region of the transistor is formed along with a bottom surface and both sidewalls of the channel trench 114. Accordingly, the length of the channel region is increased in a limited area. As a result, the conventional short channel effect can be minimized, and the punch-through characteristic between the source/drain regions 128 is improved.

FIGS. 3 to 10 are cross-sectional views illustrating a method for forming a semiconductor device in accordance with an embodiment of the present invention.

Figure 3:
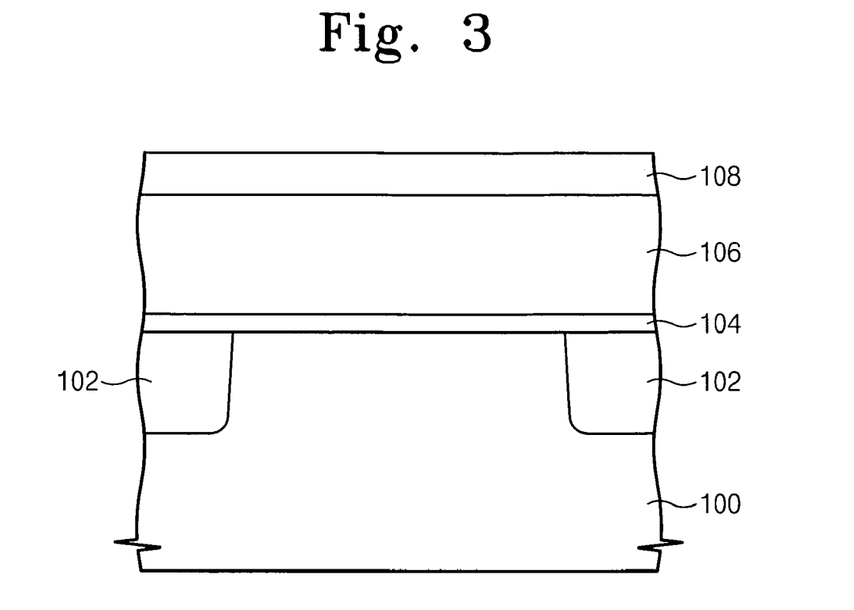
FIGS. 3 to 10 are cross-sectional views illustrating a method for forming a semiconductor device in accordance with an embodiment of the present invention.

With reference to FIG. 3, a device isolation layer 102 is formed at a predetermined region of a substrate 100 to define an active region. The device isolation layer 102 may be formed of a shallow trench type device isolation layer.

A buffer insulating layer 104, a mold layer 106 and a hard mask layer 108 are sequentially formed on the substrate 100. The buffer insulating layer 104 may be formed of a CVD silicon oxide layer. Especially, the buffer insulating layer 104 may be formed of a MTO layer. The mold layer 106 may be formed of a silicon germanium layer or a polysilicon layer. The hard mask layer 108 may be formed of a material layer having an etch selectivity with respect to the mold layer 106, the buffer insulating layer 104 and the substrate 100, for example, a silicon nitride layer.

The hard mask layer 108 can be omitted. In this case, it is preferable that the mold layer 106 has an etch selectivity with respect to the substrate 100. Accordingly, the mold layer 106 may be formed of a silicon germanium layer. The buffer insulating layer 104 can be also omitted.

Figure 4:
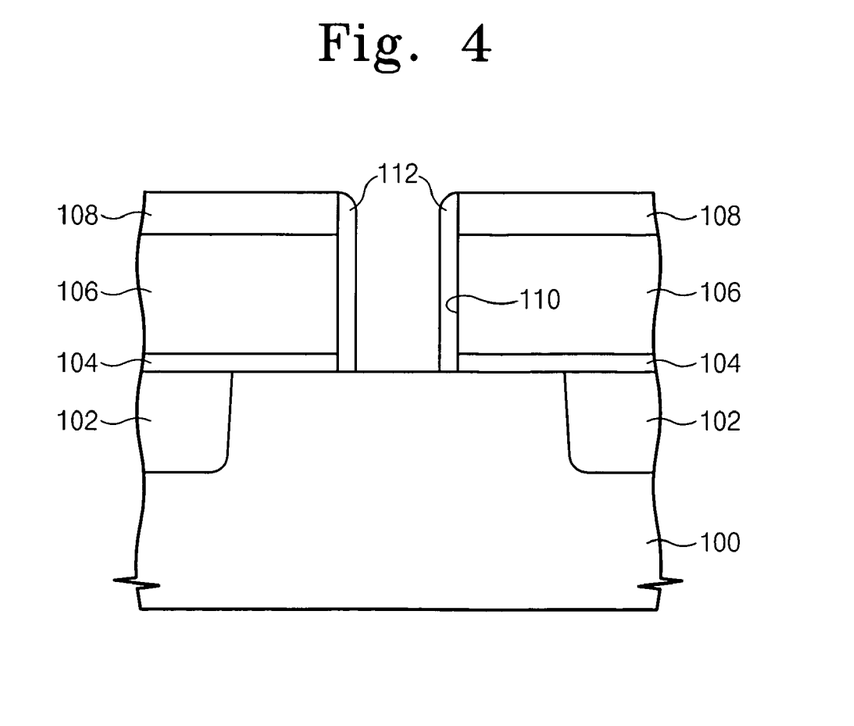
Figure 5:
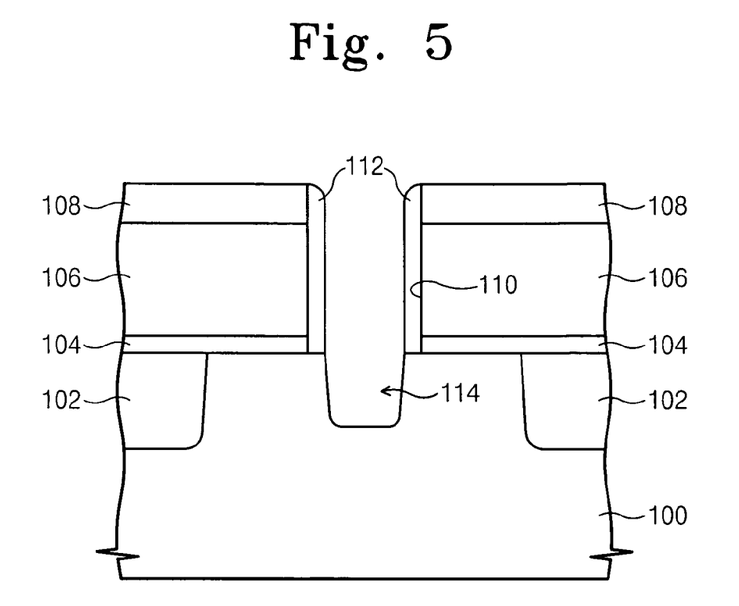

With reference to FIGS. 4 and 5, the hard mask layer 108, the mold layer 106 and the buffer insulating layer 104 are successively patterned to form an opening 110 exposing a predetermined region at the active region. The hard mask layer 108 is patterned using a photoresist pattern, and the mold layer 106 and the buffer insulating layer 104 are etched using the patterned hard mask layer 108 as an etching mask to form the opening 110. The opening 110 may have a groove shape crossing over the active region.

A sidewall spacer 112 may be formed on sidewalls of the opening 110. The active region exposed to the opening 110 is etched using the hard mask layer 108 and the sidewall spacer 112 as an etching mask to form a channel trench 114. Accordingly, inner sidewalls of the channel trench 114 are self-aligned on inner sidewalls of the opening 110. Especially, the channel trench 114 can be self-aligned on the sidewall spacer 112. A width of the channel trench 114 may be formed to be smaller than that of the minimum line-width which can be defined by a photolithography process. In other words, if the opening 110 is formed to have the minimum line-width which can be defined by a photolithography process, the channel trench 114 is formed to have a smaller width than the minimum line-width which can be defined by a photolithography process due to the sidewall spacer 112. The step of forming the sidewall spacer 112 can be omitted when occasion demands. If the sidewall spacer 112 is omitted, the channel trench 114 may be formed by etching the exposed substrate using the hard mask layer 108 as an etching mask. In this case, the inner sidewalls of the channel trench 114 are self-aligned on the inner sidewalls of the opening 110.

Figure 6:
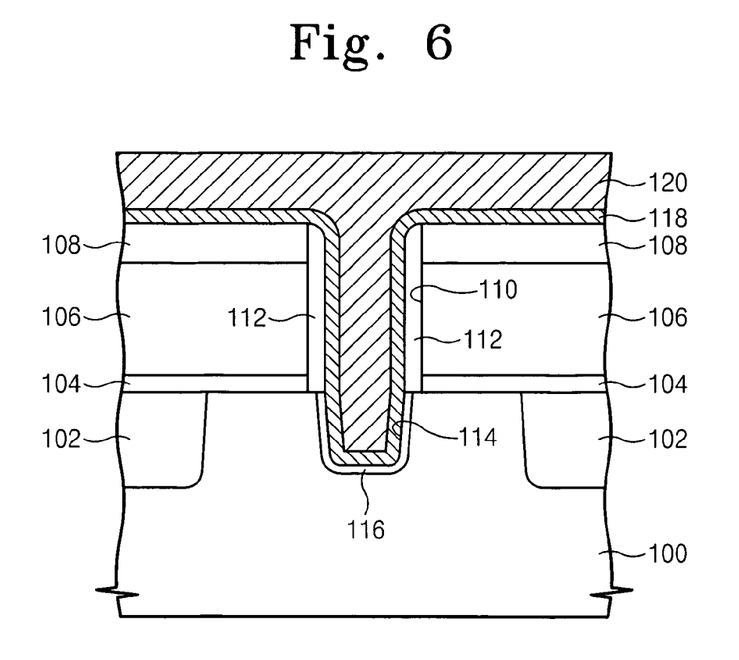
Figure 7:
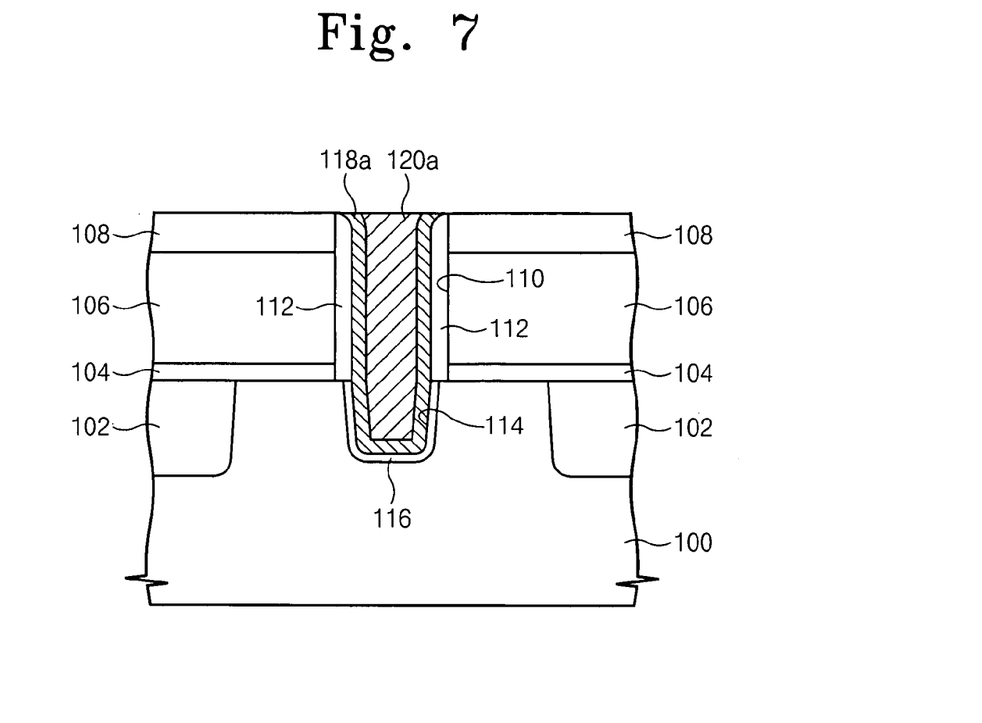

With reference to FIGS. 6 and 7, a gate insulating layer 116 is formed on the bottom surface and inner sidewalls of the channel trench 114. The gate insulating layer 116 may be formed of a thermal oxide layer. Unlike this, the gate insulating layer 116 may be formed of a high-k dielectric layer having a higher dielectric constant than a silicon nitride layer. The high-k dielectric layer may be formed of a metal oxide layer. For example, the high-k dielectric layer may be formed of one of an aluminum oxide layer or a hafnium oxide layer, or a combination thereof. The high-k dielectric layer may be formed with a chemical vapor deposition method or an atomic layer stacking method. Accordingly, if the gate insulating layer 116 is formed of the high-k dielectric layer, the gate insulating layer 116 may be conformally formed on the substrate 100 having the bottom surface and inner sidewalls of the channel trench 114 and inner sidewalls of the opening 110. In the drawings, the gate insulating layer 116 is formed of a thermal oxide layer.

A conformal barrier conductive layer 118 is formed on the substrate 100 having the gate insulating layer 116. The barrier conductive layer 118 may include a conductive metal nitride layer. For example, the barrier conductive pattern 118 may be formed of one of a titanium nitride (TiN), titanium/titanium nitride (Ti/TiN), tantalum nitride (TaN), tantalum/tantalum nitride (Ta/TaN), silicon-titanium nitride (TiSiN) or silicon-tantalum nitride (TaSiN) or a combination thereof.

A metal layer 120 filling the channel trench 114 and an opening 110 is formed on the barrier conductive layer 118. It is preferable that the metal layer 120 is formed of a lower resistivity metal than a polycide layer. For example, the metal layer 120 may be formed of one of tungsten, aluminum, copper or molybdenum, or a combination thereof.

The barrier conductive layer 118 may be omitted when occasion demands. In this case, the channel trench 114 and the opening 110 are filled with the metal layer 120.

The metal layer 120 and the barrier conductive layer 118 are planarized until the hard mask layer 108 is exposed to form a barrier conductive pattern 118a and a metal gate electrode 120a, which are sequentially stacked in the channel trench 114 and the opening 110.

In the other method, in a planarization process, the hard mask layer 108 is removed to expose the mold layer 106. In other words, the metal layer 120, the barrier conductive layer 118 and the hard mask layer 108 are planarized until the mold layer 106 is exposed. At this time, the upper portion of the sidewall spacer 112 formed on the sidewalls of the hard mask layer 108 may be also removed. It is preferable that the planarization process is performed with a chemical mechanical polishing process. Unlike this, the planarization process can be performed with an etch back process. In the drawings, the metal layer 120 and the barrier conductive layer 118 are planarized.

Figure 8:
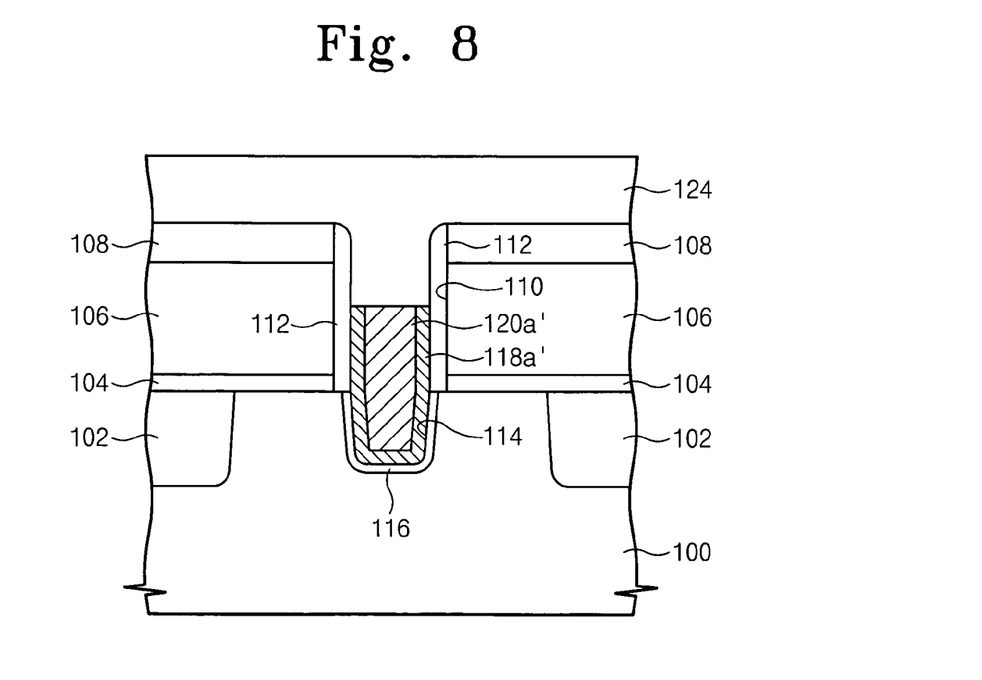
Figure 9:
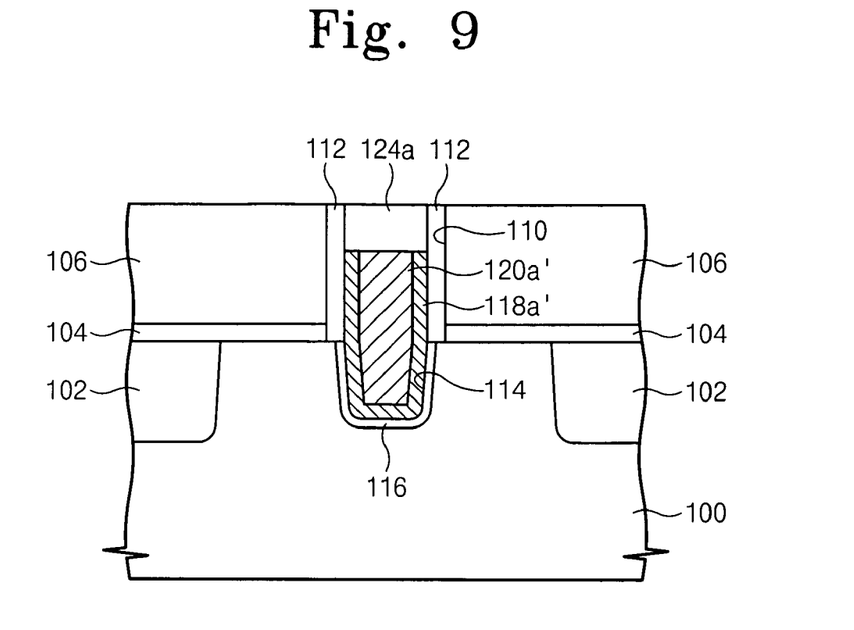

With reference to FIGS. 8 and 9, the upper surfaces of the metal gate electrode 120a and the barrier conductive pattern 118a are recessed to empty a portion of the opening 110. The upper surfaces of the recessed metal gate electrode 120a' and the barrier conductive pattern 118a' may be lower than the top surface of the mold layer 106.

A capping layer 124 filling an empty region of the opening 110 is formed on the substrate 100. The capping layer 124 is formed of an insulating material having an etch selectivity with respect to the mold layer 106 and the buffer insulating layer 106. For example, the capping layer 124 may be formed of a silicon nitride layer. The capping layer 124 and the hard mask layer 108 are planarized until the mold layer 106 is exposed to form a capping pattern 124a on the recessed metal gate electrode 120a' and the barrier conductive pattern 118a'. At this time, an upper portion of the sidewall spacer 112 formed on a sidewall of the hard mask layer 108 is also removed. The sidewalls of the capping pattern 124a are self-aligned on the outer sidewalls of the recessed barrier conductive pattern 118a' by the opening 110 and the sidewall spacer 112. If the barrier conductive layer 118 is omitted, the sidewalls of the capping pattern 124a are self-aligned on the sidewalls of the metal gate electrode 120a' recessed by the opening 110 and the sidewall spacer 112.

In the meantime, in the case that the hard mask layer 108 is removed when the metal gate electrode 120a is formed, the capping pattern 124a is planarized until the mold layer 106 is exposed.

Figure 10:
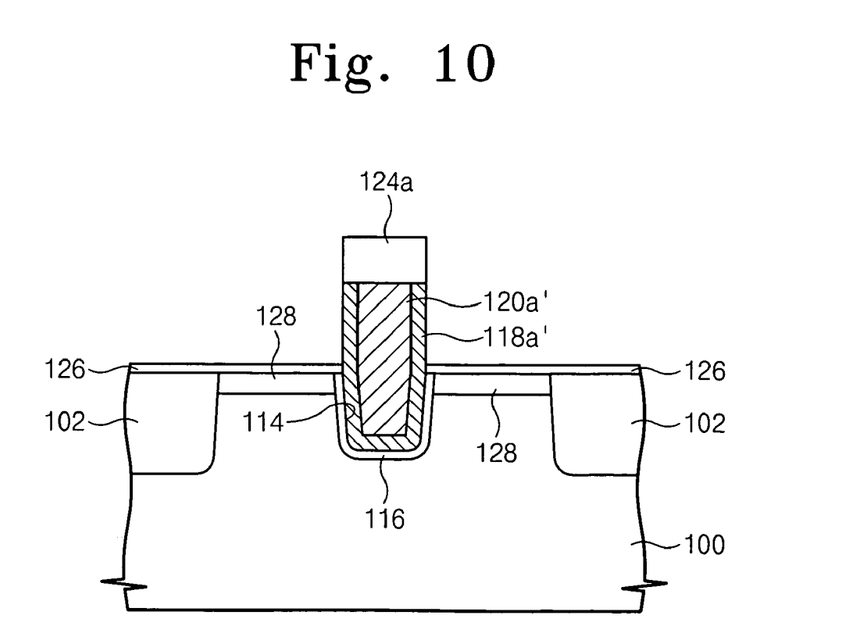

With reference to FIG. 10, the mold layer 106 is removed from the substrate 100 having the capping pattern 124a. Subsequently, the buffer insulating layer 104 may be removed. The sidewall spacer 112 may be formed of a material having the same etch ratio as the mold layer 106. Unlike this, the buffer insulating layer 104 may be formed of a material having the same etch ratio as the mold layer 106. Accordingly, the sidewall spacer 112 is removed together with the mold layer 106 or the buffer insulating layer 104. Preferably, the sidewall spacer 112 has the same etch ratio as the buffer insulating layer 104. For example, the buffer insulating layer 104 may be formed of a CVD silicon oxide layer, especially, an MTO layer. Subsequently, an ion implantation buffer layer 126 is formed on a surface of the substrate 100 and impurity ions are implanted using the metal gate electrode 120a' and the capping pattern 124a as a mask to form source/drain regions 128. The ion implantation buffer layer 126 is formed of an insulating layer such as a silicon oxide layer. The source/drain regions 128 are formed in the active region at both sides of the metal gate electrode 120a'. At this time, it is preferable that a lower surface of the source/drain regions 128 is formed to be higher than the bottom surface of the channel trench 114.

Subsequently, a gate insulating spacer 130, as shown in FIG. 2, is formed. The gate insulating spacer 130 is formed to cover both sidewalls of the capping pattern 124a and both sidewalls of the protruded upper portion of the metal gate electrode 120a'. At this time, the barrier conductive pattern 118a' is interposed between the gate insulating spacer 130 and the metal gate electrode 120a'.

Subsequently, impurity ions may be implanted using the capping pattern 124a and the gate insulating spacer 130 as a mask. In this case, the source/drain regions 128 may have a LDD structure.

In a method for forming the above described semiconductor device, the metal gate electrode 120a' is formed of a lower resistivity metal than the conventional polycide. Therefore, it is possible to realize a high speed semiconductor device by increasing an operational speed of a transistor.

In addition, a channel region below the metal gate electrode 120a' is formed along with the sidewalls and the bottom surface of the channel trench 114. Accordingly, a short channel effect is minimized by increasing the channel length in a limited area and the punch-through characteristic between the source/drain regions 128 is improved.

Furthermore, a line-width of the metal gate electrode 120a' may be formed to be smaller than the minimum line-width which can be defined by a photolithography process due to the sidewall spacer 112. Accordingly, it is possible to provide a highly integrated semiconductor device.

In addition, the metal gate electrode 120a' is formed in the opening 110 and the channel trench 114 which are self-aligned to each other in the planarization process. Accordingly, the gate insulating layer 116 between the metal gate electrode 120a' and the channel region is not plasma-damaged. In other words, the process for forming the metal gate electrode 120a' does not require a patterning process including a photoresist pattern and a plasma-etching. Accordingly, the gate insulating layer 116 at a portion which is adjacent to the source/drain regions 128 is not plasma-damaged. As a result, it is possible to prevent a transistor from being deteriorated due to plasma damage of a conventional gate oxide layer.

Moreover, although the metal gate electrode 120a' is not formed in a patterning process, the capping pattern 124a is formed to be self-aligned on the metal gate electrode 120a' by the opening 110.

As a result, a highly integrated and high speed semiconductor device can be realized.

As described above, according to the present invention, a metal gate electrode is formed in an opening in a mold layer and a channel trench in an active region by a planarization process. Accordingly, a high speed semiconductor device can be realized by a low resistance of the metal gate electrode, and a highly integrated semiconductor device is realized by increasing a channel length in a limited area. In addition, it is possible to prevent characteristics of a transistor from being deteriorated by preventing plasma damage on a gate insulating layer.

In addition, a sidewall spacer is formed on inner sidewalls of the opening to realize a metal gate electrode of which a line-width is smaller than the minimum line-width which can be defined with a photolithography process. Thus, it is possible to produce a more highly integrated semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a metal gate electrode disposed on a substrate, a lower portion of the metal gate electrode filling a channel trench formed at a predetermined region of the substrate and an upper portion of the metal gate electrode protruding out of the substrate;
   a gate insulating layer interposed between sidewalls and a bottom surface of the channel trench, and the metal gate electrode;
   source/drain regions formed at the substrate at both sides of the metal gate electrode; and
   a capping pattern disposed on the metal gate electrode, wherein the capping pattern has sidewalls aligned with sidewalls of the metal gate electrode.

2. The semiconductor device of claim 1, wherein the bottom surface of the channel trench is lower than that of the source/drain regions.

3. A method of forming a semiconductor device comprising:
   patterning a mold layer formed on a substrate to form an opening exposing a predetermined region of the substrate;
   forming a sidewall spacer on inner sidewalls of the opening:
   etching the exposed substrate to form a channel trench;
   forming a gate insulating layer on inner sidewalls and a bottom surface of the channel trench;
   forming a metal layer on an entire surface of the substrate by filling the opening and the channel trench;
   removing a part of the metal layer to form a metal gate electrode in the opening and the channel trench;
   removing the mold layer; and
   forming source/drain regions at a substrate at both sides of the metal gate electrode.

4. The method of claim 3, wherein the bottom surface of the channel trench is formed to be lower than that of the source/drain regions.

5. The method of claim 3, wherein the channel trench is formed by etching the exposed substrate using the mold layer and the sidewall spacer as a mask.

6. The method of claim 5, further comprising removing the sidewall spacer after forming the metal gate electrode.

7. The method of claim 3, further comprising:
   conformally forming a barrier conductive layer on a substrate having the gate insulating layer before forming the metal layer, wherein the step of forming the metal gate electrode comprises: removing a part of the metal layer and a part of the barrier conductive layer to form a barrier conductive pattern and a metal gate electrode, which are sequentially stacked in the opening and the channel trench.

8. The method of claim 7, before removing the mold layer, further comprising: recessing the metal gate electrode and a top surface of the barrier conductive pattern to empty a part of the opening; and forming a capping pattern in an empty region of the opening.

9. The method of claim 8, after removing the mold layer, further comprising: forming a gate insulating spacer covering both sidewalls of the capping pattern and both sidewalls of the protruded portion of the metal gate electrode, wherein a part of the barrier conductive pattern is interposed between the metal gate electrode and the gate insulating spacer.

10. A method of forming a semiconductor device comprising:
    patterning a mold layer formed on a substrate to form an opening exposing a predetermined region of the substrate;
    etching the exposed substrate to form a channel trench;
    forming a gate insulating layer on inner sidewalls and a bottom surface of the channel trench;
    forming a metal layer on an entire surface of the substrate by filling the opening and the channel trench;
    removing a part of the metal layer to form a metal gate electrode in the opening and the channel trench;
    recessing an upper surface of the metal gate electrode to empty a part of the opening;
    forming a capping pattern in an empty region of the opening;
    removing the mold layer; and
    forming source/drain regions at a substrate at both sides of the metal gate electrode.

11. A method of forming a semiconductor device comprising:
    patterning a mold layer formed on a substrate to form an opening exposing a predetermined region of the substrate;
    etching the exposed substrate to form a channel trench;
    forming a gate insulating layer on inner sidewalls and a bottom surface of the channel trench;
    forming a metal layer on an entire surface of the substrate by filling the opening and the channel trench;
    removing a part of the metal layer to form a metal gate electrode in the opening and the channel trench;
    removing the mold layer;
    forming source/drain regions at a substrate at both sides of the metal gate electrode;
    forming a buffer insulating layer on the substrate before forming the mold layer, wherein the opening is formed by successively patterning the mold layer and the buffer insulating layer; and
    removing the buffer insulating layer after removing the mold layer.

12. The method of claim 11, further comprising:
    forming a hard mask layer on the mold layer after forming the mold layer, wherein the opening is formed by successively patterning the hard mask layer, the mold layer and the buffer insulating layer; and
    removing the hard mask layer before removing the mold layer.

13. A semiconductor device comprising:
a metal gate electrode disposed on a substrate, a lower portion of the metal gate electrode filling a channel trench formed at a predetermined region of the substrate and an upper portion of the metal gate electrode protruding out of the substrate;
a gate insulating layer interposed between sidewalls and a bottom surface of the channel trench, and the metal gate electrode;
source/drain regions formed at the substrate at both sides of the metal gate electrode;
a barrier conductive pattern interposed between the gate insulating layer and the metal gate electrode, wherein both ends of the barrier conductive pattern are extended upwardly to cover both sidewalls of an upper portion of the metal gate electrode; and
a capping pattern disposed on the metal gate electrode, wherein the capping pattern has a sidewall aligned on a sidewall of the extended portion of the barrier conductive pattern.

14. The semiconductor device of claim 13, further comprising a gate insulating spacer to cover the sidewalls of the capping pattern and the upper portion of the metal gate electrode, wherein the extended portion of the barrier conductive pattern is interposed between the metal gate electrode and the gate insulating spacer.

15. A method of forming a semiconductor device comprising:
patterning a mold layer formed on a substrate to form an opening exposing a predetermined region of the substrate;
etching the exposed substrate to form a channel trench;
forming a gate insulating layer on inner sidewalls and a bottom surface of the channel trench;
forming a metal layer on an entire surface of the substrate by filling the opening and the channel trench;
removing a part of the metal layer to form a metal gate electrode in the opening and the channel trench;
removing the mold layer; and
forming source/drain regions at a substrate at both sides of the metal gate electrode, wherein the bottom surface of the channel trench is formed to be lower than that of the source/drain regions.

* * * * *